(12) United States Patent
Harikai et al.

(10) Patent No.: US 9,780,021 B2
(45) Date of Patent: Oct. 3, 2017

(54) METHOD OF MANUFACTURING ELEMENT CHIP, METHOD OF MANUFACTURING ELECTRONIC COMPONENT-MOUNTED STRUCTURE, AND ELECTRONIC COMPONENT-MOUNTED STRUCTURE

(71) Applicant: Panasonic Intellectual Property Management Co., Ltd., Osaka (JP)

(72) Inventors: Atsushi Harikai, Osaka (JP); Shogo Okita, Hyogo (JP); Noriyuki Matsubara, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/408,770

(22) Filed: Jan. 18, 2017

(65) Prior Publication Data
US 2017/0229385 A1  Aug. 10, 2017

(30) Foreign Application Priority Data
Feb. 4, 2016  (JP) .................. 2016-019867

(51) Int. Cl.
| | |
|---|---|
| *H01L 21/44* | (2006.01) |
| *H01L 21/48* | (2006.01) |
| *H01L 21/50* | (2006.01) |
| *H01L 23/498* | (2006.01) |
| *H01L 23/00* | (2006.01) |
| *H01L 23/31* | (2006.01) |

(Continued)

(52) U.S. Cl.
CPC ...... *H01L 23/49811* (2013.01); *H01L 21/563* (2013.01); *H01L 21/78* (2013.01); *H01L 23/3171* (2013.01); *H01L 24/09* (2013.01); *H01L 24/89* (2013.01); *H01L 2224/80801* (2013.01); *H01L 2924/15323* (2013.01)

(58) Field of Classification Search
CPC ... H01L 21/563; H01L 21/78; H01L 23/3171; H01L 24/09; H01L 24/89; H01L 23/49811
USPC ............................... 438/9, 110, 798
See application file for complete search history.

(56) References Cited

U.S. PATENT DOCUMENTS

| | | | |
|---|---|---|---|
| 7,994,026 B2* | 8/2011 | Harikai | H01J 37/32743 257/E21.214 |
| 2009/0023295 A1* | 1/2009 | Arita | H01L 21/3065 438/710 |
| 2017/0092527 A1* | 3/2017 | Harikai | H01L 21/6836 |

(Continued)

FOREIGN PATENT DOCUMENTS

JP  2002-093752 A  3/2002

*Primary Examiner* — Thien F Tran
(74) *Attorney, Agent, or Firm* — Pearne & Gordon LLP

(57) ABSTRACT

To provide a method of manufacturing an element chip in which creep-up of a conductive material can be suppressed in a mounting step. In a plasma processing step that is used in the method of manufacturing the element chip for manufacturing a plurality of element chips by dividing a substrate which has a plurality of element regions and of which an element surface is covered by an insulating film, the substrate is divided into the element chips by exposing the substrate to a first plasma, the element chips having a first surface, a second surface, and a side surface are held spaced from each other on a carrier, and the side surface and the insulating film are in a state of being exposed.

6 Claims, 9 Drawing Sheets

(51) Int. Cl.
*H01L 21/78* (2006.01)
*H01L 21/56* (2006.01)

(56) References Cited

U.S. PATENT DOCUMENTS

2017/0098590 A1* 4/2017 Harikai .............. H01L 21/0212
2017/0098591 A1* 4/2017 Harikai .............. H01L 23/3185

* cited by examiner

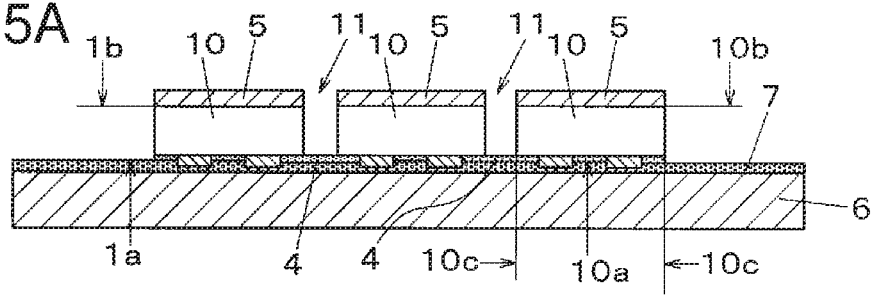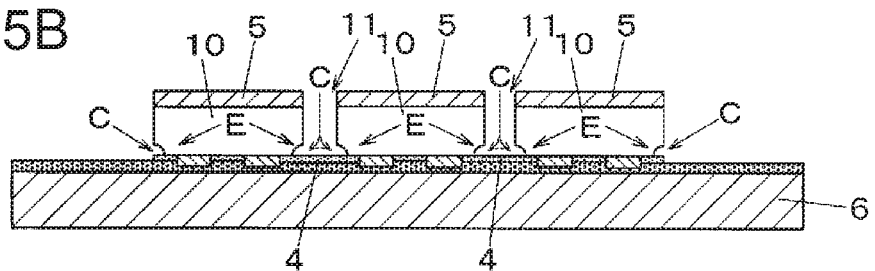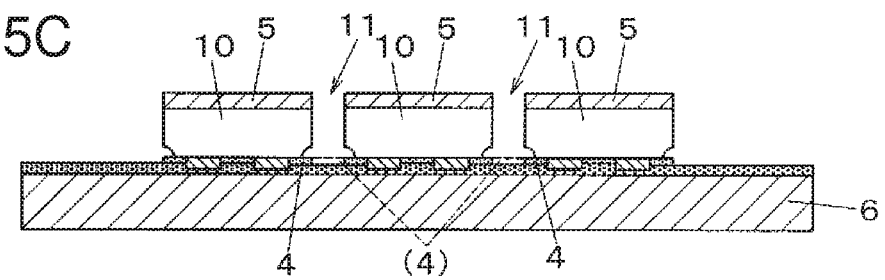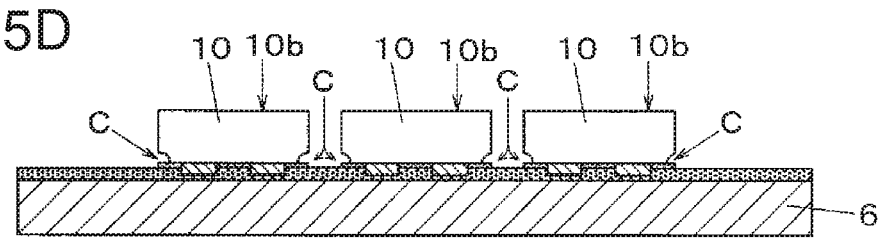

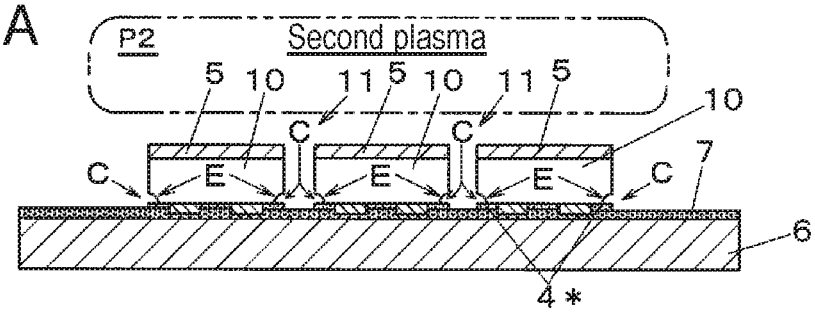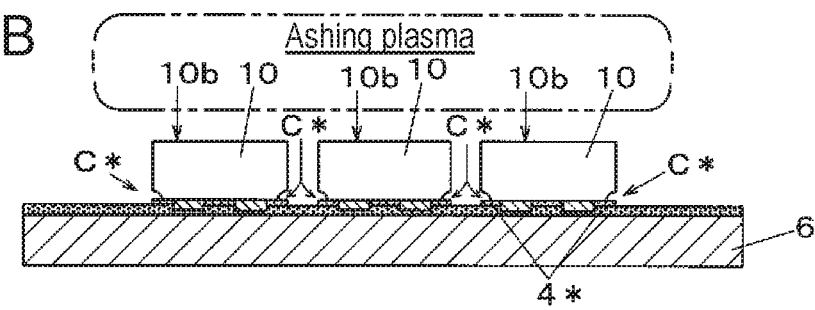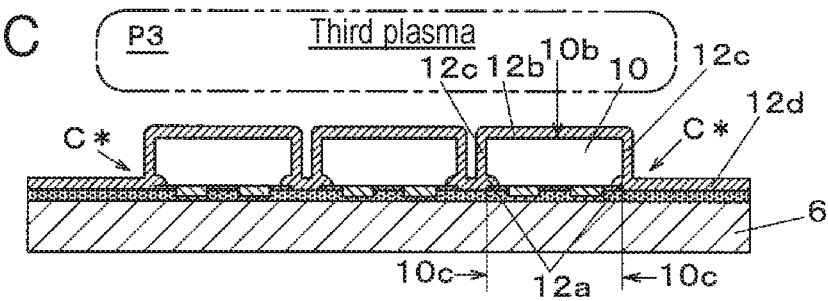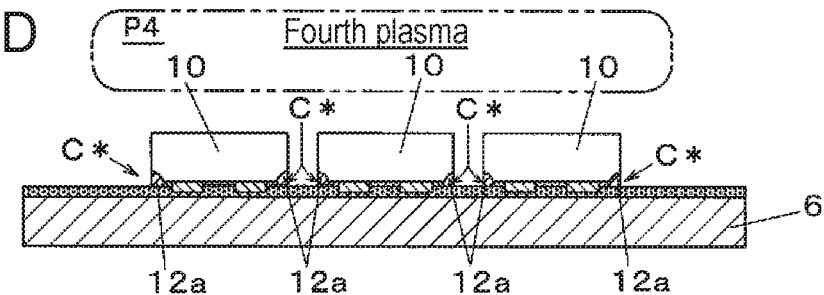

METHOD OF MANUFACTURING ELEMENT CHIP, METHOD OF MANUFACTURING ELECTRONIC COMPONENT-MOUNTED STRUCTURE, AND ELECTRONIC COMPONENT-MOUNTED STRUCTURE

BACKGROUND

1. Technical Field

The present disclosure relates to a method of manufacturing an element chip in which element chips are manufactured by dividing a substrate having a plurality of element regions for each element region, a method of manufacturing an electronic component-mounted structure which is formed by mounting the element chip on a substrate, and an electronic component-mounted structure.

2. Description of the Related Art

An element chip such as a semiconductor element is manufactured by dividing a wafer substrate having a plurality of element regions into individual pieces (for example, see PTL 1). In the related art illustrated in PTL 1, first, a back surface of a wafer is polished and the wafer is thinned by etching in a state where a front surface of the wafer is stuck to a back grinding tape. Thereafter, a resist layer is formed in a portion corresponding to the element region for masking, and the wafer is subjected to plasma etching, thereby separating the wafer into individual pieces of the semiconductor elements.

CITATION LIST

Patent Literature

PTL 1: Japanese Patent Unexamined Publication No. 2002-93752

SUMMARY

An individual piece of the element chip that is cut out from the wafer substrate in the above-described manner may not only be used as a device after packaging is performed but also may be sent to an electronic component mounting step in a form of the element chip as it is as in a case of a Wafer Level Chip Size Package (WLCSP) or the like. In such a case, the element chip is mounted in a manner in which a circuit-formed surface comes directly into contact with a conductive material such as cream solder or silver paste for bonding.

An object of the disclosure is to provide a method of manufacturing an element chip in which creep-up of a conductive material in a mounting step can be suppressed, a method of manufacturing an electronic component-mounted structure, and an electronic component-mounted structure.

A method of manufacturing an element chip of the disclosure, in which a plurality of element chips are manufactured by dividing a substrate, which includes a first surface having a plurality of element regions defined by dividing regions and of which at least a part is covered with an insulating film, a second surface on a side opposite to the first surface, at the dividing regions, has the following features. That is, the method includes a preparing step of preparing the substrate in which the first surface side is supported on a carrier and an etching-resistant layer is formed so as to cover regions of the second surface opposite to the element regions and to expose regions of the second surface opposite to the dividing regions; and a plasma processing step of performing plasma processing on the substrate that is supported on the carrier after a preparing step. The plasma processing step includes a dividing step, a recessed portion forming step that is performed after the dividing step, and a protection film forming step that is performed after the recessed portion forming step. In the dividing step, the substrate is divided into the element chips by etching the substrate of regions which are not covered by the etching-resistant layer in a depth direction of the substrate up to the first surface by exposing the second surface to first plasma. Therefore, each of the element chips including the first surface, the second surface, and a side surface connecting the first surface and the second surface is caused to be in a state of being held spaced from each other on the carrier and to expose the side surface and the insulating film. In the recessed portion forming step, recessed portions are formed by partially removing regions being in contact with the insulating film among the side surfaces that are exposed by exposing the element chips to second plasma in a state where the element chips are held spaced from each other on the carrier. In the protection film forming step, a protection film is formed on the second surface of the element chips, the side surface of the element chips, and the recessed portions by exposing the element chips to third plasma generated during supplying of protection film forming gas in a state where the element chips are held spaced from each other on the carrier.

A method of manufacturing an electronic component-mounted structure of the disclosure, which is formed by bonding element electrodes included on the first surface of an element chip formed by the method of manufacturing an element chip of the disclosure to land electrodes formed in a printed circuit board by bonding portions formed by the element electrodes and solders, has the following features. That is, the method includes a solder paste supplying step of supplying solder paste including a solder on the land electrodes; and a mounting step of mounting the element electrodes on the printed circuit board by causing the element electrodes to be landed on the solder paste supplied on the corresponding to land electrodes. Therefore, the method includes a melting step of forming the bonding portions for soldering between the element electrodes and the land electrodes by melting the solder by heating the printed circuit board; and a cooling step of solidifying the melted solder by cooling the printed circuit board. In the melting step, the protection film that is formed in the recessed portions suppresses creep-up of the melted solder on the side surface.

An electronic component-mounted structure of the disclosure, which is formed by bonding element electrodes formed in an element chip to land electrodes formed in a printed circuit board by solder, has the following features. That is, the element chip has the element electrodes that are formed in a surface opposite to the printed circuit board, the recessed portions that are formed in corner portions of a side surface of the element chip on the printed circuit board side, and a protection film that covers the recessed portions. Creep-up of the solder on the side surface is suppressed by the protection film.

According to the disclosure, it is possible to suppress creep-up of a conductive material in the mounting structure.

BRIEF DESCRIPTION OF THE DRAWINGS

FIG. 5A is an explanatory view of a step in a method (second example) of manufacturing the element chip of an embodiment of the disclosure;

FIG. 5B is an explanatory view of a step in the method (second example) of manufacturing the element chip of an embodiment of the disclosure;

FIG. 5C is an explanatory view of a step in the method (second example) of manufacturing the element chip of an embodiment of the disclosure;

FIG. 5D is an explanatory view of a step in the method (second example) of manufacturing the element chip of an embodiment of the disclosure;

FIG. 6A is an explanatory view of a step in a method (third example) of manufacturing the element chip of an embodiment of the disclosure;

FIG. 6B is an explanatory view of a step in the method (third example) of manufacturing the element chip of an embodiment of the disclosure;

FIG. 6C is an explanatory view of a step in the method (third example) of manufacturing the element chip of an embodiment of the disclosure;

FIG. 6D is an explanatory view of a step in the method (third example) of manufacturing the element chip of an embodiment of the disclosure;

DETAILED DESCRIPTION

Prior to the description of an embodiment of the disclosure, problems in the device of the related art will be briefly described.

As described above, in a case where the element chip such as the WLCSP is sent to an electronic component mounting step as it is, the element chip is mounted in a manner in which the circuit-formed surface comes directly into contact with the conductive material such as cream solder or silver paste for bonding. In the mounting step, the conductive material that is pressed and expanded during mounting the element chip is spread not only on the bonding portion of the circuit-formed surface but also on a side surface or a back surface of the element chip, that is, a so-called "creep-up" may occur. The creep-up of the conductive material causes various problems such as causing short-circuit between adjacent electrodes and an increase in current consumption by forming an unnecessary electric circuit on the side surface of the element chip. Therefore, it is required to suppress the creep-up of the conductive material in the mounting step.

Next, an embodiment of the disclosure will be described with reference to the drawings.

First Example

First, a first example in a method of manufacturing an element chip of the embodiment will be described with reference to FIGS. 1A to 1C and 2A to 2D. The method of manufacturing the element chip illustrated in here is used for manufacturing a plurality of element chips by dividing a substrate, which includes a first surface having a plurality of element regions defined by dividing regions and of which at least a part is covered by an insulating film, and a second surface on a side opposite to the first surface, into the dividing regions.

Figure 1A:
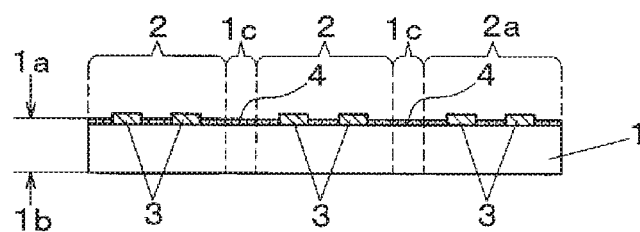
FIG. 1A is an explanatory view of a step in a method (first example) of manufacturing an element chip of an embodiment of the disclosure.

As illustrated in FIG. 1A, substrate 1 is a wafer substrate where a plurality of element chips 10 (see FIG. 1C) are formed on first surface 1a. First surface 1a that is an element surface in which an element portion is formed is covered by insulating film 4 formed of an inorganic film such as a silicon oxide film, a silicon nitride film, and a silicon oxynitride film in substrate 1. A plurality of element regions 2 defined by dividing regions 1c are set in first surface 1a. A plurality of element electrodes 3 for connection are formed in each element region 2 so as to protrude from insulating film 4 or so that at least a part thereof exposes from opening provided in insulating film 4.

Figure 1B:
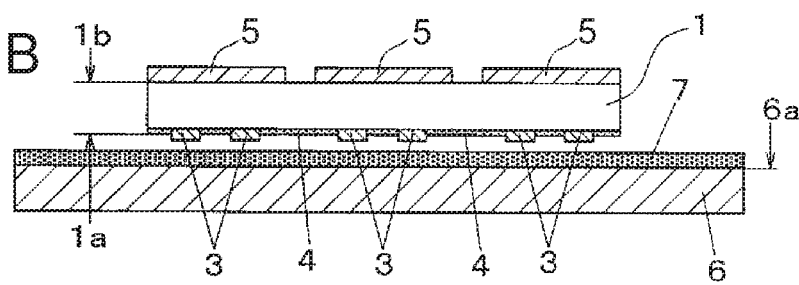
FIG. 1B is an explanatory view of a step in the method (first example) of manufacturing the element chip of an embodiment of the disclosure.

Substrate 1 is sent to a preparing step for manufacturing the element chips and, as described below, support is performed by carrier 6 and mask formation is performed. As carrier 6, a dicing tape that is held by a dicing frame or a support substrate that includes adhesive layer 7 in holding surface 6a may be exemplified. In the preparing step, as illustrated in FIG. 1B, etching-resistant layer 5 that functions as a mask in plasma dicing is formed in second surface 1b. That is, etching-resistant layers 5 are formed in second surface 1b so as to cover regions of second surface 1b facing element regions 2 and expose regions of second surface 1b facing dividing regions 1c. In addition, first surface 1a side of substrate 1 is supported on holding surface 6a of carrier 6 by partially embedding a tip end surface of element electrode 3 in adhesive layer 7 of carrier 6. Moreover, in the preparing step, the mask formation may be performed before being supported by carrier 6 or after being supported by carrier 6.

Figure 3:
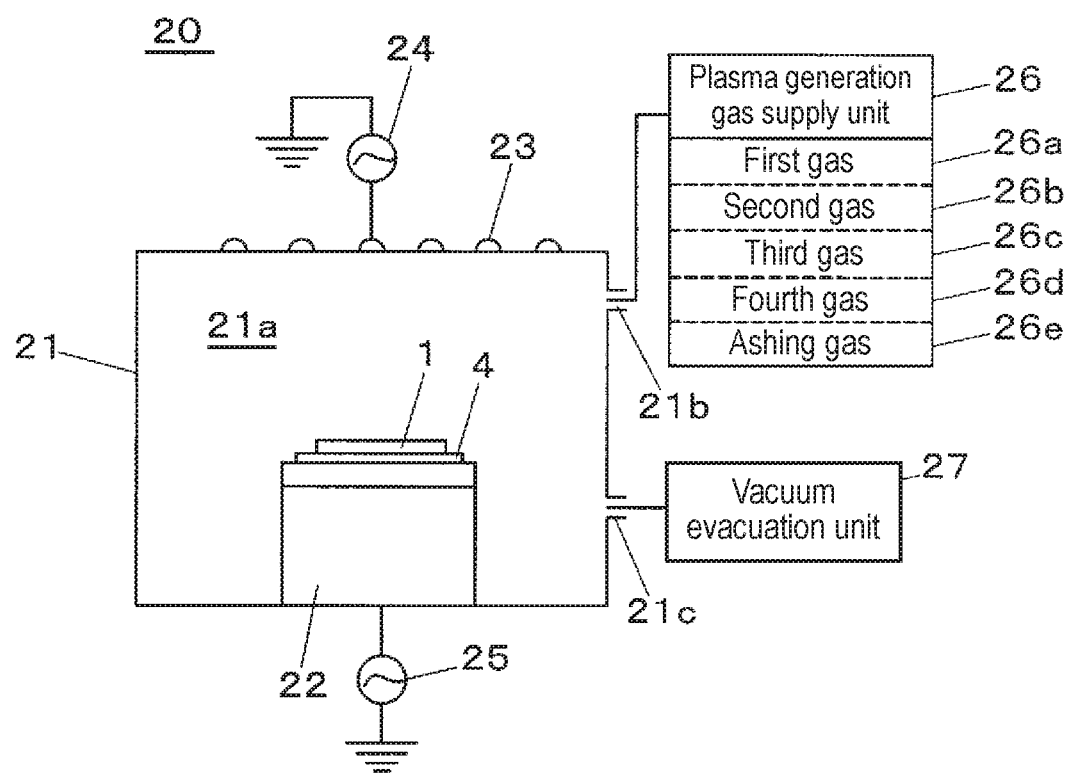
FIG. 3 is an explanatory view of a configuration of a plasma etching device that is used in the method of manufacturing the element chip of an embodiment of the disclosure.

After performing the preparing step as described above, in order to perform plasma processing on substrate 1 that is supported on carrier 6, carrier 6 is sent to a plasma processing step. A configuration of plasma etching device 20 that is used in the plasma processing step will be described with reference to FIG. 3. In FIG. 3, an inside of chamber 21 that is a vacuum vessel is processing chamber 21a for performing plasma processing and stage 22, on which carrier 6 supporting substrate 1 that is to be processed is mounted, is disposed on a bottom portion of processing chamber 21a. Antennas 23 as upper electrodes are disposed on an upper surface of a top portion of chamber 21 and antenna 23 is electrically connected to first high-frequency power supply unit 24. Stage 22 within processing chamber 21a also has a function as a lower electrode for performing plasma processing and stage 22 is electrically connected to second high-frequency power supply unit 25.

Vacuum evacuation unit 27 is connected to chamber 21 via exhaust port 21c and the inside of processing chamber 21a is evacuated by driving vacuum evacuation unit 27. Furthermore, plasma generation gas supply unit 26 is connected to processing chamber 21a via gas inlet port 21b. In plasma etching device 20 illustrated in the embodiment, it is possible to selectively supply a plurality of types of plasma generation gas depending on the purpose of plasma processing. Here, as the types of plasma generation gas, first gas 26a, second gas 26b, third gas 26c, fourth gas 26d, and ashing gas 26e may be selected.

As first gas 26a, gas such as $SF_6$ which is excellent in etching effect for silicon is used. In the embodiment, first gas 26a is used for generating first plasma P1 to divide substrate 1 by plasma etching. Similar to first gas 26a, second gas 26b is used for etching effect for silicon as a target, in the embodiment, after substrate 1 is divided by plasma etching, second gas 26b is used for forming recessed portions C (see FIG. 2A) by removing corner portions E of the bottom portion of etching groove 11.

Third gas 26c is gas for plasma CVD to form a film by plasma processing and gas containing fluorocarbon such as $C_4F_8$, $C_2F_6$, $CF_4$, $C_6F_6$, $C_6F_4H_2$, $CHF_3$, and $CH_2F_2$ is used for third gas 26c. In the embodiment, third gas 26c is used as gas for forming the protection film to form the protection film on the side surface, second surface 1b, and side surface 10c of element chip 10, and recessed portions C obtained by dividing substrate 1.

Fourth gas 26d is gas for protection film etching and gas such as $SF_6$ gas, oxygen gas, and argon gas which are excellent in physical etching effect is used for fourth gas 26d. In the embodiment, fourth gas 26d is used for sputtering for removing an unnecessary portion among the protection film described above. Ashing gas 26e is oxygen gas and, in the embodiment, is used for the purpose of removing the organic film, for example, removing etching-resistant layer 5 or partially removing insulating film 4 for forming recessed portion C* (see FIGS. 6B to 6D and 7B) after completion of the mask function.

In plasma processing by plasma etching device 20, first, substrate 1 to be processed is mounted on stage 22 together with carrier 6 and the inside of processing chamber 21a is excavated to be vacuum by driving vacuum evacuation unit 27. At the same time, plasma generation gas depending on the purpose of plasma processing is supplied on the inside of processing chamber 21a by plasma generation gas supply unit 26 and the inside of processing chamber 21a is maintained at a predetermined pressure. In this state, high-frequency power is supplied on antenna 23 by first high-frequency power supply unit 24 and thereby plasma according to the type of plasma generation gas, which is supplied, is generated on the inside of processing chamber 21a.

In this case, a bias voltage is applied to stage 22 as the lower electrode by second high-frequency power supply unit 25. Therefore, it is possible to exert a biasing effect for promoting entry of plasma generated on the inside of processing chamber 21a in a direction of stage 22 and to perform anisotropic etching by enhancing a plasma processing effect in a desired specific direction.

Figure 1C:
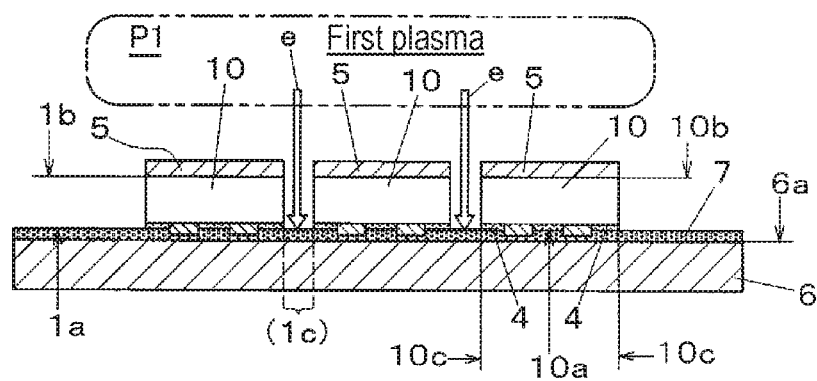
FIG. 1C is an explanatory view of a step in the method (first example) of manufacturing the element chip of an embodiment of the disclosure.

In the plasma processing step, first, processing is executed by first plasma P1 using first gas 26a described above. As illustrated in FIG. 1C, regions which are not covered by etching-resistant layer 5, that is, substrate 1 of regions corresponding to dividing regions 1c illustrated in FIG. 1A are etched (see arrows e) until reaching first surface 1a in the depth direction of substrate 1 by exposing second surface 1b of substrate 1 to first plasma P1 described above. Etching grooves 11 (see FIG. 2A) separating each element chip 10 are formed, and substrate 1 is divided into element chips 10 of individual pieces.

That is, element chips 10 including first surface 10a that is first surface 1a, second surface 10b that is second surface 1b in the state of substrate 1, and side surface 10c connecting first surface 10a and second surface 10b are in a state of being held spaced from each other on carrier 6 by dividing substrate 1. With this division, side surface 10c of element chip 10 and an end portion of insulating film 4 is in a state of being exposed on the inside of etching groove 11 (dividing step).

Etching conditions in the dividing step can be appropriately selected depending on a material of substrate 1. In a case where substrate 1 is a silicon substrate, for etching in the dividing step, a so-called Bosch process can be used. In the Bosch process, it is possible to burrow the region that is not covered by etching-resistant layer 5 perpendicular to the depth direction of the substrate 1 by sequentially repeating a deposition film depositing step, a deposition film etching step, and a silicon etching step.

As conditions of the deposition film depositing step, for example, a pressure on the inside of processing chamber is adjusted to 15 to 25 Pa while supplying $C_4F_8$ as raw material gas at 150 to 250 sccm, input power from first high-frequency power supply unit 24 to antenna 23 is 1500 to 2500 W, input power from second high-frequency power supply unit 25 to the lower electrode is 0 W, and a processing time may be 5 to 15 seconds. As conditions of the deposition film etching step, for example, the pressure on the inside of processing chamber is adjusted to 5 to 15 Pa while supplying SF$_6$ as raw material gas at 200 to 400 sccm, input power from first high-frequency power supply unit 24 to antenna 23 is 1500 to 2500 W, input power from second high-frequency power supply unit 25 to the lower electrode is 100 to 300 W, and the processing time may be 2 to 10 seconds. Here, sccm is a unit indicating the amount of flow of a gas. That is, 1 sccm indicates the amount of flow of a gas that flows by 1 cm$^3$ per minute at 0° C. and 1 atmosphere (standard condition).

As conditions of the silicon etching step, for example, the pressure on the inside of processing chamber is adjusted to 5 to 15 Pa while supplying SF$_6$ as raw material gas at 200 to 400 sccm, input power from first high-frequency power supply unit 24 to antenna 23 is 1500 to 2500 W, input power from second high-frequency power supply unit 25 to the lower electrode is 50 to 200 W, and the processing time may be 10 to 20 seconds. In these conditions, it is possible to burrow the silicon substrate at a speed of 10 μm/min by repeating the deposition film depositing step, the deposition film etching step, and the silicon etching step.

Figure 2A:
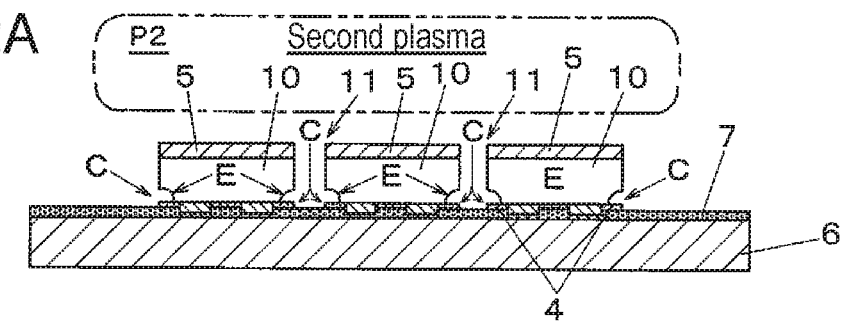
FIG. 2A is an explanatory view of a step in the method (first example) of manufacturing the element chip of an embodiment of the disclosure.

After the dividing step described above, element chip 10 is exposed by second plasma P2 in a state where spaces are held on carrier 6. That is, as illustrated in FIG. 2A, second plasma P2 using second gas 26b is generated on the inside of processing chamber 21a in plasma etching device 20 and corner portions E are formed in recessed portions C by partially removing regions being in contact with insulating film 4 among side surfaces 10c that are exposed in the dividing step (recessed portion forming step).

Figure 4A:
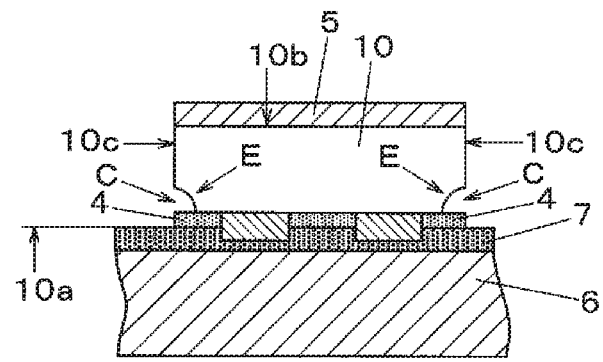
FIG. 4A is an enlarged explanatory view in step description of the method (first example) of manufacturing the element chip of an embodiment of the disclosure.

The formation of recessed portion C is performed as follows. That is, the etching is processed in the dividing step, substrate 1 and insulating film 4 are removed, and then the ions of the plasma incident on etching groove 11 is incident on adhesive layer 7. Since adhesive layer 7 is an insulator, a positive charge is accumulated by the incident of the ions on the surface of adhesive layer 7. As described above, if adhesive layer 7 is in a state of being charged to the positive charge, the newly incident ions lose linearity by the repulsive force between the positive charges in the bottom portion of etching groove 11 and the trajectory is bent. The ions in which the trajectory is bent are incident on the region being in contact with insulating film 4 among side surfaces 10c exposing in the bottom portion on the inside of etching groove 11. As illustrated in FIG. 4A, recessed portions C in which the regions being in contact with insulating film 4 among side surfaces 10c are partially removed are formed in corner portions E that are formed by first surface 10a and side surface 10c.

As conditions of the recessed portion formation, for example, the pressure on the inside of processing chamber is adjusted to 5 to 15 Pa while supplying SF$_6$ at 200 to 400 sccm as raw material gas, input power from first high-frequency power supply unit 24 to antenna 23 is 1500 to 2500 W, input power from second high-frequency power supply unit 25 to the lower electrode may be 50 to 200 W. In the conditions, it is possible to form the recessed portion at a speed of appropriately 5 μm/min.

Figure 2B:
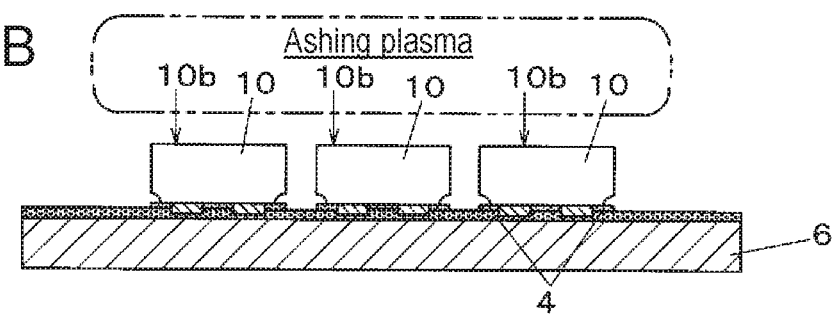
FIG. 2B is an explanatory view of a step in the method (first example) of manufacturing the element chip of an embodiment of the disclosure.
Figure 2C:
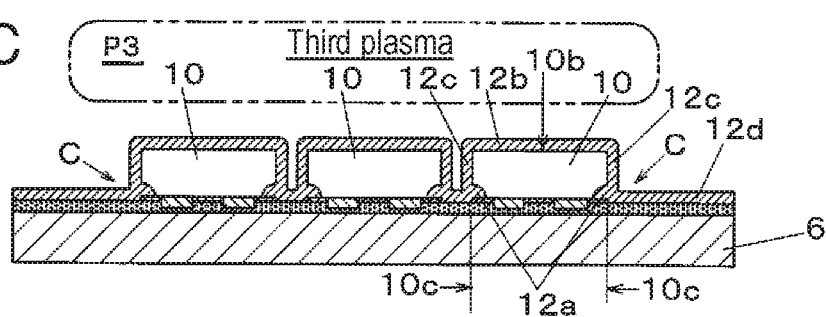
FIG. 2C is an explanatory view of a step in the method (first example) of manufacturing the element chip of an embodiment of the disclosure.

After the recessed portion forming step described above, element chip 10 is exposed by the plasma for the ashing in a state of being spaced from each other on carrier 6. That is, as illustrated in FIG. 2B, in plasma etching device 20, the plasma for the ashing using ashing gas 26e is generated on the inside of processing chamber 21a and etching-resistant layer 5 consisting mainly of resin is removed by the ashing. Therefore, second surface 10b of element chip 10 that is divided into individual piece is in the state of being exposed.

Conditions of ashing can be appropriately selected in accordance with a material of etching-resistant layer 5. For example, in a case where etching-resistant layer 5 is a resist film, the pressure on the inside of processing chamber is adjusted to 5 to 15 Pa while supplying oxygen at 150 to 300 sccm and supplying CF$_4$ at 0 to 50 sccm as raw material gas, input power from first high-frequency power supply unit 24 to antenna 23 is 1500 to 2500 W, input power from second high-frequency power supply unit 25 to the lower electrode may be 0 to 30 W. In the conditions, it is possible to remove etching-resistant layer 5 at a speed of appropriately 1 μm/min.

Figure 4B:
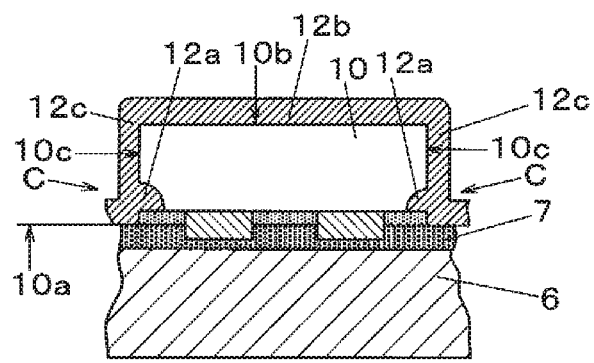
FIG. 4B is an enlarged explanatory view in the step description of the method (first example) of manufacturing the element chip of an embodiment of the disclosure.

Next, after the ashing step described above, as illustrated in FIG. 2C, a protection film forming step is performed. That is, in plasma etching device 20, element chips 10 are exposed to third plasma P3 generated while supplying third gas 26c that is protection film forming gas (gas containing fluorocarbon) on the inside of processing chamber 21a in a state of being held spaced from each other on carrier 6. Therefore, as illustrated in FIG. 4B, protection films 12b and 12c made of a film containing mainly fluorocarbon obtaining fluorine and carbon, where fluorocarbon in protection film forming gas is decomposed in the plasma and then being deposited and coated, is formed on each of second surface 10b and side surfaces 10c of element chip 10. At the same time, protection films 12a having the same compositions are also formed in the inside of recessed portions C that is formed in the recessed portion forming step in a form of filling recessed portions C.

Protection films 12a formed on the inside of recessed portions C are formed for the purpose of suppressing creep-up of the conductive material in the mounting process for directly bonding element chip 10 to the package substrate and the like. Therefore, it is preferable that the protection films have less hygroscopicity and dense composition. In the embodiment, as raw material gas of third plasma P3 used for forming the protection films, since protection film forming gas containing fluorocarbon is used, it is possible to form the protection films made of fluorocarbon film which has less hygroscopicity and dense composition, and excellent in adhesion. In the protection film forming step, high-frequency bias is applied to stage 22 (see FIG. 3) on which carrier 6 is mounted. Therefore, incidence of ions into element chip 10 is promoted and it is possible to form the protection film having more dense composition and high adhesion.

As conditions of the protection film formation, for example, the pressure on the inside of processing chamber is adjusted to 15 to 25 Pa while supplying C$_4$F$_8$ at 150 sccm and He at 50 sccm as raw material gas, input power from first high-frequency power supply unit 24 to antenna 23 is 1500 to 2500 W, input power from second high-frequency power supply unit 25 to the lower electrode may be 50 to 150 W. In the conditions, it is possible to form the protection film having a thickness of 3 μm by being processed for 300 seconds. In the embodiment, as raw material gas, mixed gas of fluorocarbon and helium is used and this is because dissociation of raw material gas is promoted in plasma by mixing helium and, as a result, it is possible to form the protection film which is dense and has high adhesion.

In the condition examples described above, the ratio of the flow ratio of He to the total flow rate of raw material gas is 25% (=50/(150+50)×100). As described below, it is preferable that the ratio is between 10% and 80%. That is, if the ratio of the flow ratio of He to the total flow rate of raw material gas is greater than 10%, the dissociation of raw gas is easily facilitated in the plasma and, as a result, it is possible to form the protection film which is further dense and has high adhesion. On the other hand, if the ratio of the flow ratio of He to the total flow rate of raw material gas is greater than 80%, the ratio of $C_4F_8$ occupied in raw material gas is reduced. Therefore, supply of components (C, F, and compounds thereof) in plasma contributing to the protection film formation to the surface of the substrate is insufficient, a deposition rate of the protection film on the surface of the substrate is slow, and productivity is lowered.

Next, a protection film removing step for removing an unnecessary portion of the protection film formed in the protection film forming step is performed. In the protection film forming step described above, protection film 12b is also formed on side surfaces 10c and second surface 10b together with first surface 10a of element chip 10 and recessed portion C (see FIG. 4B). In the embodiment, since protection films 12b and 12c are not necessary, plasma processing is performed using fourth plasma P4 for removing the films.

Figure 2D:
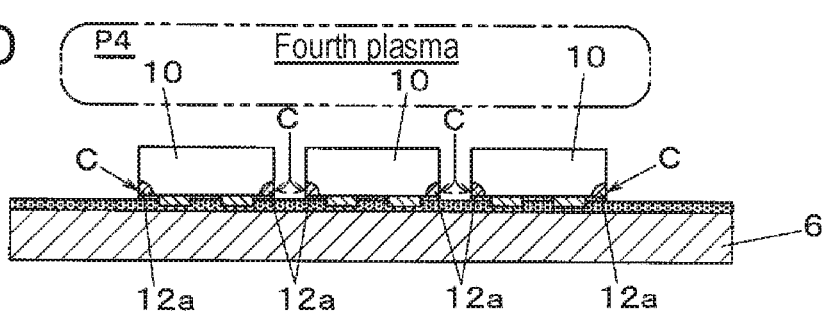
FIG. 2D is an explanatory view of a step in the method (first example) of manufacturing the element chip of an embodiment of the disclosure.

That is, in plasma etching device 20, fourth plasma P4 is generated while supplying fourth gas 26d that is protection film etching gas of which components are argon gas and oxygen gas on the inside of processing chamber 21a. As illustrated in FIG. 2D, element chips 10 are exposed to fourth plasma P4 in a state of being held spaced from each other on carrier 6. Therefore, at least a part of the protection film 12a formed in recessed portion C is left and protection film 12b that is formed on second surface 10b exposed on the upper surface in element chip 10 and protection film 12c that is formed on side surfaces 10c are removed by an etching operation of fourth plasma P4.

Figure 4C:
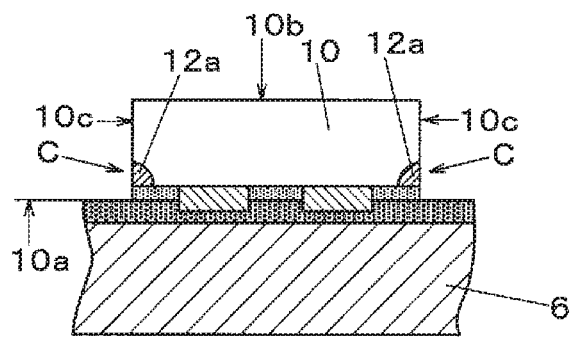
FIG. 4C is an enlarged explanatory view in the step description of the method (first example) of manufacturing the element chip of an embodiment of the disclosure.

Therefore, as illustrated in FIG. 4C, second surface 10b and side surfaces 10c of element chip 10 are in a state of being exposed. Protection film 12d (see FIG. 2C) of a range in which element chip 10 is not covered among protection films which are adhered on the upper surface of carrier 6 is also removed. Therefore, in element chip 10 after the protection film removing step, protection film 12a is in a state of being left only on the inside of recessed portion C.

As conditions of removing of the protection film, for example, the pressure on the inside of processing chamber is adjusted to 0.2 to 1.5 Pa while supplying Ar at 150 to 300 sccm and $O_2$ at 0 to 150 sccm as raw material gas, input power from first high-frequency power supply unit 24 to antenna 23 is 1500 to 2500 W, input power from second high-frequency power supply unit 25 to the lower electrode may be 150 to 300 W. In the conditions, it is possible to etch the protection film exposed to the upper surface at a speed of appropriately 0.5 µm/min.

Second Example

In the first example of the embodiment described above, the recessed portion forming step illustrated in FIG. 2A is performed in a state where insulating film 4 is removed on the inside of etching groove 11 that is formed in the dividing step and adhesive layer 7 is exposed. However, as in the second example illustrated in FIGS. 5A to 5D, the recessed portion forming step may be executed in a state where insulating film 4 that is an inorganic insulating film is left.

That is, in the dividing step illustrated in FIG. 5A, plasma processing similar to the example illustrated in FIG. 1C is performed. Therefore, substrate 1 is etched in a depth direction of substrate 1 and etching grooves 11 separating each element chip 10 are formed and divide substrate 1 into element chips 10 of individual pieces. In this case, the etching is stopped in a state where insulating film 4 is left in a bottom portion of etching groove 11 and the recessed portion forming step is executed in this state.

That is, in the recessed portion forming step illustrated in FIG. 5B, similar to the example illustrated in FIG. 2A, recessed portions C are formed in corner portions E by partially removing regions being in contact with insulating film 4 among side surfaces 10c that are exposed in the dividing step. The formation of recessed portions C is performed in a state where insulating film 4 that is the inorganic insulating film is left in the bottom portion of etching groove 11.

Also in this case, ions that newly enter in a state where insulating film 4 is charged by electric charge cause a trajectory to be bent by a repulsive force between positive charges in the bottom portion of etching groove 11, and are incident on regions being in contact with insulating film 4 among side surfaces 10c exposing in the bottom surface on the inside of etching groove 11. Similar to the first example, recessed portions C are formed by partially removing the regions being in contact with insulating film 4 among side surfaces 10c in corner portions E that are formed by first surface 10a and side surface 10c by the etching operation of the ions.

Thereafter, as illustrated in FIG. 5C, an insulating film removing step of removing insulating film 4 that is left in the bottom portion of etching groove 11 is performed by plasma processing. In the bottom portion of etching groove 11, the anisotropic etching incident causing the plasma to be incident on insulating film 4 in the perpendicular direction is performed. Therefore, insulating film 4 that is left in the bottom portion of etching groove 11 is removed. Conditions of the insulating film removing step can be appropriately selected according to the material of insulating film 4. For example, in a case where insulating film 4 is a silicon oxide film, for example, the pressure on the inside of processing chamber is adjusted to 0.5 to 5 Pa while supplying Ar at 200 to 500 sccm and $CF_4$ at 10 to 50 sccm as raw material gas, input power from first high-frequency power supply unit 24 to antenna 23 is 1500 to 2500 W, input power from second high-frequency power supply unit 25 to the lower electrode may be 300 to 1000 W. In the conditions, it is possible to remove the insulating film at a speed of appropriately 0.3 µm/min.

Next, similar to the example illustrated in FIG. 2B, ashing step is executed. That is, as illustrated in FIG. 5D, etching-resistant layer 5 is removed by the plasma for ashing. Therefore, second surface 10b of element chip 10 that is divided into individual piece is in a state of being exposed. The following processing steps are the same as the protection film forming step and the protection film removing step illustrated in FIGS. 2C and 2D in the first example.

Figure 8A:
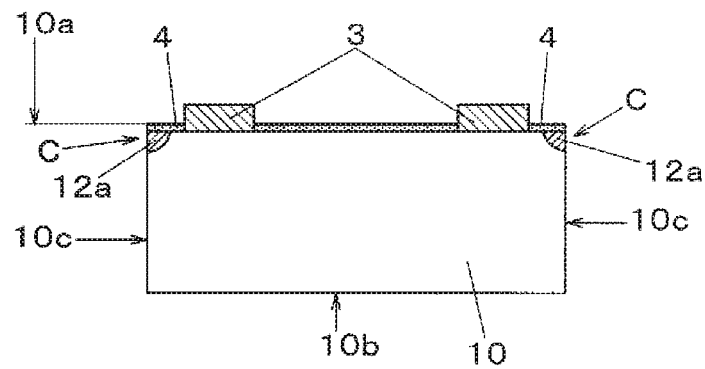
FIG. 8A is an explanatory view of a configuration of an element chip that is manufactured by the method of manufacturing the element chip of an embodiment of the disclosure.

FIG. 8A illustrates element chip 10 that is manufactured by the method of manufacturing illustrated in the first example and the second example. That is, as illustrated in FIG. 8A, element chip 10 has first surface 10a which is covered by insulating film 4 that is formed of the inorganic film such as a silicon oxide film and element electrode 3 protruding from insulating film 4 is formed in first surface 10a. Recessed portions C are formed in corner portions E formed between first surface 10a and side surface 10c by partially removing regions being in contact with insulating film 4 in side surface 10c and recessed portions C are covered by protection film 12a.

Third Example

Next, a third example in the method of manufacturing the element chip of the embodiment will be described with reference to FIGS. 6A to 6D and FIGS. 7A to 7C. In the method of manufacturing the element chip, in the first example and the second example, as insulating film 4 covering first surface 1a, the inorganic insulating film such as a silicon oxide film is used, but in the third example, as insulating film 4*, an example in which an organic film such as polyimide is used is illustrated.

FIGS. 6A to 6D illustrate a state of element chip 10 after the dividing step by plasma processing illustrated in FIG. 1C in the first example. FIGS. 6A to 6D correspond to FIGS. 2A to 2D in the first example. First, after the dividing step, as illustrated in FIG. 6A, element chips 10 are exposed by second plasma P2 in a state of being held spaced from each other on carrier 6. That is, similar to the first example, recessed portions C are formed in corner portions E by partially removing regions being in contact with insulating film 4* among side surfaces 10c that are exposed in the dividing step (recessed portion forming step).

Figure 7A:
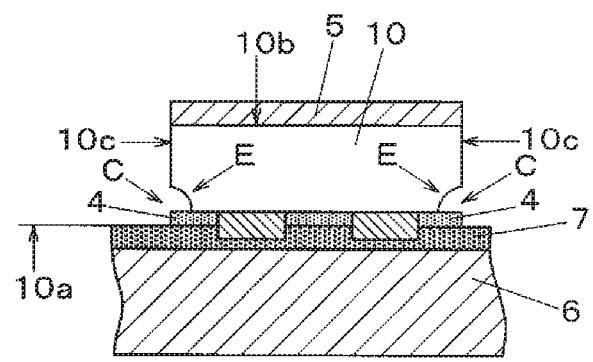
FIG. 7A is an enlarged explanatory view in a step description of the method (third example) of manufacturing the element chip of an embodiment of the disclosure.

Therefore, as illustrated in FIG. 7A, recessed portions C in which the regions coming into contact with insulating film 4* among side surfaces 10c are formed are formed in corner portions E formed by first surface 10a and side surface 10c. Recessed portions C that are formed are in a state where the end portion of insulating film 4* is left in corner portions E.

Figure 7B:
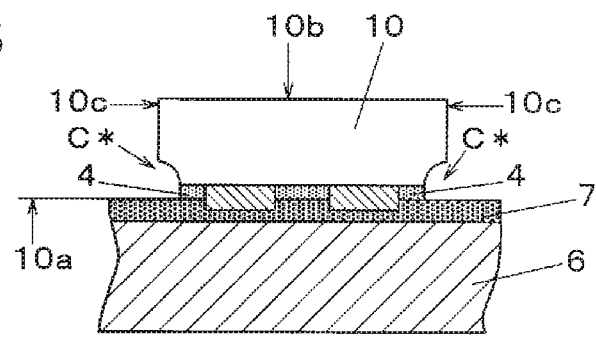
FIG. 7B is an enlarged explanatory view in a step description of the method (third example) of manufacturing the element chip of an embodiment of the disclosure.

The ashing is performed after the recessed portion forming step described above and, as illustrated in FIG. 6B, etching-resistant layer 5 is removed by the plasma for the ashing. Therefore, second surface 10b of element chip 10 that is divided into individual piece is in a state of being exposed. Insulating film 4* that is in the state of being left in corner portions E is removed by the ashing. That is, in the third example, since insulating film 4* is the organic film such as polyimide, the end portion extending to recessed portions C formed by the recessed portion forming step is removed by being in contact with the plasma for the ashing. Therefore, as illustrated in FIG. 7B, recessed portion C is expanded by a volume of insulating film 4* that is removed and becomes recessed portion C.

Figure 7C:
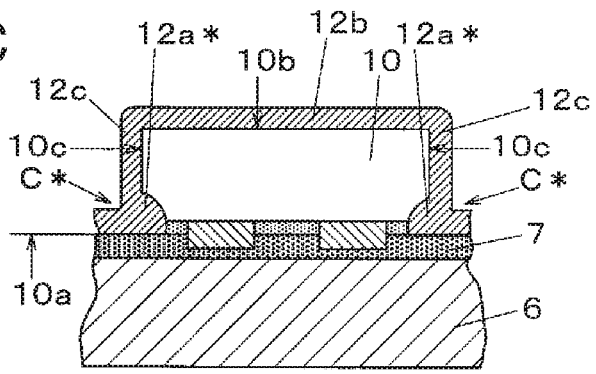
FIG. 7C is an enlarged explanatory view in a step description of the method (third example) of manufacturing the element chip of an embodiment of the disclosure.

Next, after the ashing step described above, as illustrated in FIG. 6C, the protection film forming step is executed and element chip 10 is exposed by third plasma P3. Therefore, as illustrated in FIG. 7C, protection films 12b and 12c that are formed by the fluorocarbon film consisting fluorine and carbon are formed in second surface 10b and side surface 10c of element chip 10. At the same time, protection film 12a having the same compositions and the same functions as those illustrated in the first example is also formed in recessed portion C* that is formed in the recessed portion forming step and the ashing step in a state of filling the inside of recessed portion C*.

Next, the protection film removing step is executed for removing unnecessary protection films 12b and 12c among the protection films formed in the protection film forming step. That is, as illustrated in FIG. 6D, protection film 12b and protection film 12c that are formed in element chip 10 are removed by the etching operation of fourth plasma P4 while leaving at least a part of protection film 12a formed on the inside of recessed portion C* by exposing element chip 10 to fourth plasma P4.

Therefore, second surface 10b and side surface 10c of element chip 10 are in a state of being exposed and protection film 12d (see FIG. 6C) of a range that is not covered by element chip 10 among the protection film adhering on the upper surface of carrier 6 is also removed. Therefore, in element chip 10 after the protection film removing step, protection film 12a is in a state of being left only on the inside of recessed portion C*.

Figure 8B:
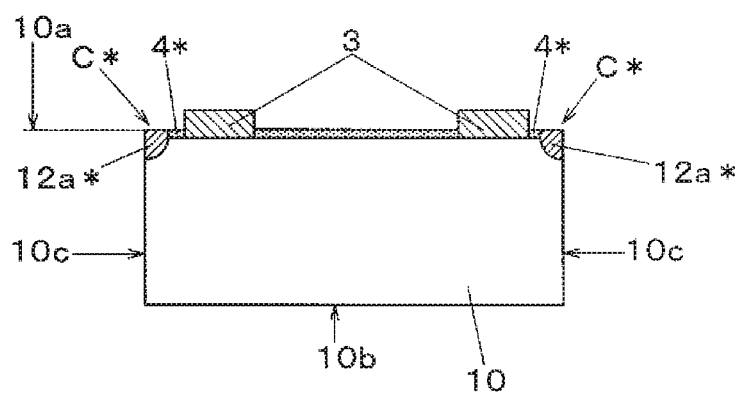
FIG. 8B is an explanatory view of a configuration of the element chip that is manufactured by the method of manufacturing the element chip of an embodiment of the disclosure.

FIG. 8B illustrates element chip 10 that is manufactured by a manufacturing step illustrated in the third example. That is, element chip 10 has first surface 10a that is covered by insulating film 4* formed of the organic film such as polyimide and element electrodes 3 protruding from insulating film 4* are formed in first surface 10a. Recessed portions C* are formed in corner portions E formed between first surface 10a and side surface 10c by partially removing regions being in contact with insulating film 4* in side surface 10c and by removing the end portion of insulating film 4*. Recessed portions C* are covered by protection film 12a*.

As described below, in a case where element chip 10 having the configuration illustrated in FIGS. 8A and 8B forms the electronic component-mounted structure by directly mounting on the printed circuit board and the like by soldering without going through a step of resin packaging and the like, spreading of the conductive material such as cream solder is suppressed in first surface 10a and an effect, in which the creep-up of the conductive material is prevented, is provided.

Figure 9A:
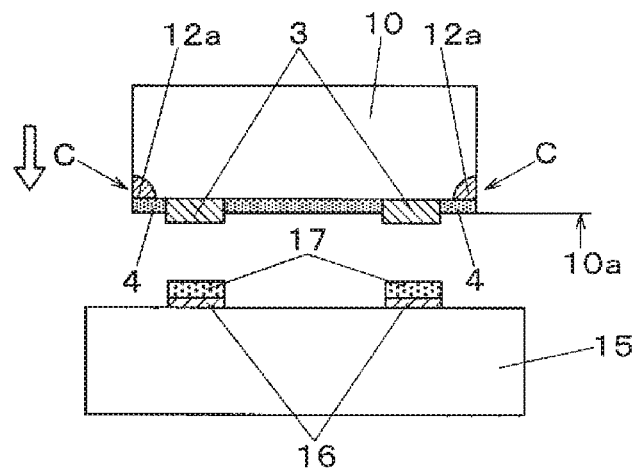
FIG. 9A is an explanatory view of a step in a method of manufacturing an electronic component-mounted structure of an embodiment of the disclosure.
Figure 9B:
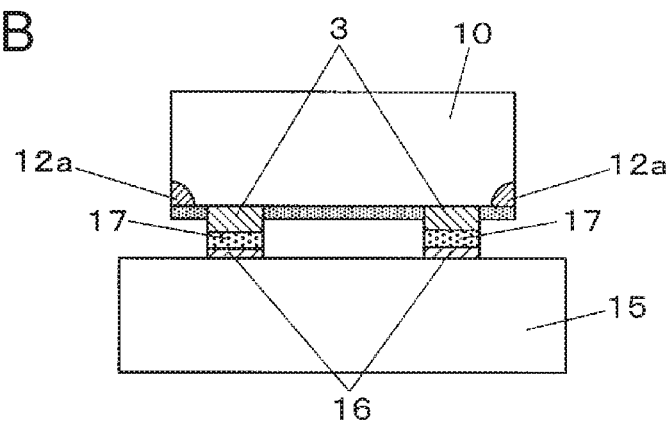
FIG. 9B is an explanatory view of a step in the method of manufacturing the electronic component-mounted structure of an embodiment of the disclosure.
Figure 9C:
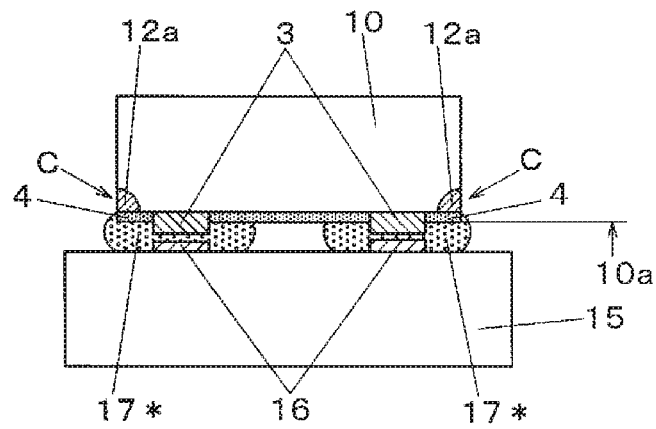
FIG. 9C is an explanatory view of a step in the method of manufacturing the electronic component-mounted structure of an embodiment of the disclosure.

Hereinafter, the electronic component-mounted structure which is formed by performing soldering the element chip 10 formed by the method of manufacturing the element chip described above to land electrodes formed in the printed circuit board, and a method of manufacturing the electronic component-mounted structure will be described with reference to FIGS. 9A to 9C. in FIG. 9A, land electrodes 16 are formed on an upper surface of printed circuit board 15 corresponding to element electrodes 3 for connecting element chips 10 having the configuration described above. Paste-like solder (solder paste) 17 is supplied on land electrode 16 before mounting element chip 10 (solder paste supplying step).

Element chip 10 is mounted on printed circuit board 15 after the solder paste supplying step (mounting step). That is, element electrodes 3 of element chip 10 are aligned to corresponding land electrodes 16 and, as illustrated in FIG. 9B, element electrodes 3 are landed on the solders 17 on land electrodes 16. Therefore, element chip 10 is mounted on printed circuit board 15.

Next, printed circuit board 15 after the mounting step is sent to a reflow step and here, heating is performed for soldering. That is, printed circuit board 15 is heated, solders 17 are melted, and thereby element electrode 3 and land electrodes 16 are solder-jointed (melting step). Thereafter, printed circuit board 15 is cooled and melted solder is cooled and solidified (cooling step). Therefore, as illustrated in FIG. 9C, soldering portions 17* for solder-jointing element electrodes 3 and land electrodes 16 are formed.

Therefore, the electronic component-mounted structure that is formed by bonding element electrodes 3 formed in element chip 10 to land electrodes 16 formed in printed circuit board 15 using solders 17. In the electronic component-mounted structure, element chip 10 has element electrodes 3 formed on a surface facing printed circuit board 15, recessed portions C formed in corner portions E of the side surfaces of element chip 10 on printed circuit board 15 side, and protection films 12a covering recessed portions C. Element chip 10 has a form in which the creep-up of solder 17 on side surface 10c is suppressed by protection film 12a.

That is, since protection film 12a is left in recessed portion C, welding solder that is formed by causing solder 17 is molten in the melting step is in contact with protection film 12a. Surface properties of protection film 12a formed of the fluorocarbon film have a property of suppressing spreading of the melted solder. Therefore, the melted solders in which solders 17 are melted in the melting step are cooled and solidified around element electrodes 3 and land electrodes 16 without spreading along first surface 10a, and good soldering portions 17* are formed. That is, in the melting step described above, protection films 12a formed in recessed portion C suppress the creep-up of molten solder 17 to side surface 10c. An example using element chip 10 illustrated in FIG. 8A is illustrated in FIGS. 9A to 9C, but the same effects can also be obtained in element chip 10 illustrated in FIG. 8B.

Therefore, in the mounting step of bonding element chip 10 to the object to be mounted such as printed circuit board 15 via the conductive material such as solder 17, it is possible to exclude various problems that may cause the creep-up of solder 17 to side surface 10c to occur. For example, it is possible to improve the mounting quality by excluding causes of various problems such as short circuit between adjacent electrodes or an increase in current consumption due to the formation of an unnecessary electric circuit in side surface 10c of element chip 10.

The method of manufacturing the element chip, the method of manufacturing the electronic component-mounted structure, and the electronic component-mounted structure of the disclosure have the effect that creep-up of the conductive material can be suppressed in the mounting step and are useful in a field of manufacturing the element chips by dividing the substrate having the plurality of element regions for each of the element regions.

What is claimed is:

1. A method of manufacturing an element chip, in which a plurality of element chips are manufactured by dividing a substrate, which includes a first surface having a plurality of element regions defined by dividing regions and of which at least a part is covered with an insulating film, and a second surface on a side opposite to the first surface, at the dividing regions, the method comprising:
   a preparing step of preparing the substrate in which a first surface side is supported on a carrier and an etching-resistant layer is formed so as to cover regions of the second surface opposite to the element regions and to expose regions of the second surface opposite to the dividing regions; and
   a plasma processing step of performing plasma processing on the substrate that is supported on the carrier after the preparing step,
   wherein the plasma processing step includes
   a dividing step of dividing the substrate into the element chips by etching the substrate of regions which are not covered by the etching-resistant layer in a depth direction of the substrate up to the first surface by exposing the second surface to first plasma and causing each of the element chips including the first surface, the second surface, and a side surface connecting the first surface and the second surface to be in a state of being held spaced from each other on the carrier and exposing the side surface and the insulating film,
   a recessed portion forming step of forming recessed portions by partially removing regions being in contact with the insulating film among the exposed side surfaces by exposing the element chips to second plasma in a state where the element chips are held spaced from each other on the carrier after the dividing step, and
   a protection film forming step of forming a protection film on the second surface of the element chips, the side surface of the element chips, and the recessed portions by exposing the element chips to third plasma generated during supplying of protection film forming gas in a state where the element chips are held spaced from each other on the carrier after the recessed portion forming step.

2. The method of manufacturing an element chip of claim 1, further comprising:
   a protection film removing step of removing the protection film, which is formed on the second surface and the side surface of the element chips, while leaving at least a part of the protection film formed in the recessed portions by exposing the element chips to fourth plasma in a state where the element chips are held spaced from each other on the carrier after the protection film forming step.

3. The method of manufacturing an element chip of claim 1 wherein the insulating film is an inorganic insulating film.

4. The method of manufacturing an element chip of claim 1, wherein the protection film is composed mainly of fluorocarbon.

5. The method of manufacturing an element chip of claim 4, wherein the protection film forming gas contains fluorocarbon.

6. A method of manufacturing an electronic component-mounted structure which is formed by bonding element electrodes included on the first surface of an element chip formed by the method of manufacturing an element claim 1 to land electrodes formed in a printed circuit board by bonding portions formed by the element electrodes and solders, the method comprising:
   a solder paste supplying step of supplying a solder paste including a solder on the land electrodes;
   a mounting step of mounting the element electrodes on the printed circuit board by causing the element electrodes to be landed on the solder paste supplied on the corresponding land electrodes;
   a melting step of forming the bonding portions for soldering between the element electrodes and the land electrodes by melting the solder by heating the printed circuit board; and
   a cooling step of solidifying the melted solder by cooling the printed circuit board,
   wherein in the melting step, the protection film formed in the recessed portions suppresses creep-up of the melted solder on the side surface.

* * * * *